US012581958B2

(12) United States Patent
Chen et al.

(10) Patent No.: US 12,581,958 B2
(45) Date of Patent: Mar. 17, 2026

(54) ELECTRONIC ASSEMBLY

(71) Applicant: Innolux Corporation, Miaoli County (TW)

(72) Inventors: Yeong-E Chen, Miaoli County (TW); Wei-Hsuan Chen, Miaoli County (TW); Chun-Yuan Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 4 days.

(21) Appl. No.: 18/401,703

(22) Filed: Jan. 1, 2024

(65) Prior Publication Data

US 2024/0136308 A1 Apr. 25, 2024

Related U.S. Application Data

(63) Continuation of application No. 17/495,821, filed on Oct. 7, 2021, now Pat. No. 11,901,315.

(30) Foreign Application Priority Data

Mar. 4, 2021 (CN) .......................... 202110240808.7

(51) Int. Cl.
*H01L 23/498* (2006.01)
*H01L 23/64* (2006.01)
*H10D 1/68* (2025.01)

(52) U.S. Cl.
CPC ...... *H01L 23/642* (2013.01); *H01L 23/49822* (2013.01); *H01L 23/49838* (2013.01); *H10D 1/692* (2025.01)

(58) Field of Classification Search
CPC ............. H01L 23/642; H01L 23/49822; H01L 23/49838; H10D 1/692; H05K 5/13
See application file for complete search history.

(56) References Cited

U.S. PATENT DOCUMENTS

| | | | |
|---|---|---|---|
| 2013/0084679 A1* | 4/2013 | Stolze | H01L 23/3735 |
| | | | 257/E21.506 |
| 2017/0331371 A1* | 11/2017 | Parto | H01L 23/642 |
| 2022/0157810 A1* | 5/2022 | Suk | H01L 23/642 |
| 2022/0199759 A1* | 6/2022 | Chyi Liu | H01L 23/5226 |

* cited by examiner

*Primary Examiner* — Omar F Mojaddedi
(74) *Attorney, Agent, or Firm* — JCIPRNET

(57) ABSTRACT

An embodiment of the disclosure provides an electronic assembly including a stacked structure, a first integrated circuit, a first passive component, and a first electrode. The stacked structure comprises a plurality of insulating layers and a plurality of conductive layers. The first passive component is disposed between the stacked structure and the first integrated circuit. The first electrode is disposed between the stacked structure and the first passive component. The first passive component is electrically connected to the stacked structure through the first electrode.

9 Claims, 14 Drawing Sheets

191(P1)

A

P11                                                P12

SC                                                 M21
M11                                                E21
M11'
CP1                                                CP2
E11
                                                   M21'
                                                   E22
E12

P21                                                P22

A'

192(P2)

10

191(P1)

P11
V3A
SC1
212A
M11
E12
CP1'

E11

V4A

P21

V7A  V8A

D                    E

222A

E'                   D'

212A'

192(P2)

P12
V5A
M21

E21
222A'

CP2'

E22

V6A

P22

M1

10A

10A

191(P1)

P11
V3B
SC2
222B
M11
E12
CP1'

E11

232B'
222B'
V4B

P21

V7B    V8B

F                                    G

212B

G'                                   F'

V10B    V9B

P12
V5B
M21

E21
CP2'

222B'

E22

222B
V6B

P22

M1

192(P2)

10B

191(P1)

P12

CP2          M21

P11                                                        P13

M11                                                        M31

CP1                                                        CP3

E11          E21                                           E31

SC3

E12          E22                                           E32

P21                                                        P23

P22

M1

192(P2)

10C 310
320
340
330
350

300

320
310
340
330
350

300A

300B

400

ELECTRONIC ASSEMBLY

CROSS-REFERENCE TO RELATED APPLICATION

This application is a continuation application of and claims the priority benefit of a prior application Ser. No. 17/495,821, filed on Oct. 7, 2021. The prior application Ser. No. 17/495,821 claims the priority benefit of China application serial no. 202110240808.7, filed on Mar. 4, 2021. The entirety of each of the above-mentioned patent applications is hereby incorporated by reference herein and made a part of this specification.

BACKGROUND

Technical Field

An embodiment of the disclosure relates to an electronic assembly, particularly to an electronic assembly including a passive device.

Related Art

In packaging technology, a redistribution layer may be fabricated on a large-size substrate for packaging and cutting. Thereby, a large number of package devices can be manufactured at the same time. As electronic apparatuses become lighter, slimmer and more compact, applications of package devices used in the electronic apparatuses continuously become available. Along with the increasing applications of the electronic apparatuses and habits or needs of users, increasingly higher requirements have been placed on structure, quality and functional integration of the package devices. Thus, various problems are being encountered by the package devices. For example, in a package device including a capacitor, during operation at high frequencies, electrical properties at different output terminals are asymmetric (or say, directional) due to asymmetry in structure. This limits the application of the package device including a capacitor. Therefore, continuous updates and adjustments are necessary for the development of package devices.

SUMMARY

The disclosure is directed to an electronic assembly having good electrical properties.

According to an embodiment of the disclosure, an electronic assembly includes a stacked structure, a first integrated circuit, a first passive component, and a first electrode. The stacked structure comprises a plurality of insulating layers and a plurality of conductive layers. The first passive component is disposed between the stacked structure and the first integrated circuit. The first electrode is disposed between the stacked structure and the first passive component. The first passive component is electrically connected to the stacked structure through the first electrode.

Based on the above, in the package device of an embodiment of the disclosure, since the capacitor of the integrated passive device layer has symmetry, the first port and the second port have substantially the same resistance. With the above configuration, a scattering parameter measured at the first port or at the second port can be substantially the same, and a symmetric capacitor can be provided. Accordingly, a directivity problem of the capacitor can be reduced, and electrical properties of the package device can be improved.

DESCRIPTION OF THE EMBODIMENTS

Figure 1:
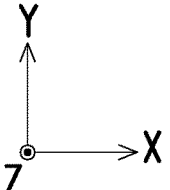
FIG. 1 is a schematic top view of a package device according to an embodiment of the disclosure.

The disclosure can be understood by reference to the following detailed description when considered in connection with the accompanying drawings. It is to be noted that, for ease of understanding and simplicity of the drawings, some of the drawings of the disclosure only illustrate a part of a package device, and specific components in the drawings are not drawn according to actual scale. In addition, the number and size of each component in the drawings are only for schematic purposes and are not intended to limit the scope of the disclosure.

Certain terms are used throughout the description and the appended claims to refer to specific components. As one skilled in the art will appreciate, package device manufacturers may refer to a component by different names. This specification is not intended to distinguish between components that differ in name but not in function. In the following description and claims, the terms such as "include," "comprise" and "have" are used in an open-ended fashion, and thus should be interpreted to mean "include, but not limited to . . . ". Therefore, the terms such as "include," "comprise" and/or "have" used in the description of the disclosure indicate existence of corresponding features, regions, steps, operations and/or members but do not exclude the existence of one or more corresponding features, regions, steps, operations and/or members.

Directional terms mentioned herein, such as "up," "down," "front," "back," "left," and "right," only refer to directions in the drawings. Therefore, the directional terms are intended to illustrate rather than limit the disclosure. Each drawing depicts general features of methods, structures and/or materials used in specific embodiments. However, the drawings should not be construed as defining or limiting the scope or nature covered by these embodiments. For example, for clarity, the relative size, thickness and position of each layer, region and/or structure may be reduced or enlarged.

In the disclosure, length and width may be measured using an optical microscope; thickness may be obtained by measurement of a cross-sectional image in an electron microscope. However, the disclosure is not limited thereto.

The terms such as "approximately," "equal to," "equal" or "same" and "substantially" or "roughly" are generally interpreted as being within 20% of a given value, or within 10%, 5%, 3%, 2%, 1%, or 0.5% of a given value.

In the disclosure, when it is described that one structure (or layer, component, substrate) is located on another structure (or layer, component, substrate), it may mean that the two structures are adjacent and directly connected to each other, or that the two structures are adjacent but not directly connected to each other. The phrase "not directly connected" means that at least one intermediate structure (or intermediate layer, intermediate component, intermediate substrate, intermediate space) is provided between the two structures. A lower surface of one structure is adjacent to or directly connected to an upper surface of the intermediate structure, and an upper surface of the other structure is adjacent to or directly connected to a lower surface of the intermediate structure. The intermediate structure may include a single-layer or multi-layer physical structure or non-physical structure without limitation. In the disclosure, when it is described that a certain structure is disposed "on" another structure, it may mean that the certain structure is "directly" on the another structure, or that the certain structure is "indirectly" on the another structure (that is, at least one structure is sandwiched between the certain structure and the another structure).

Although the terms such as "first," "second" and so on mentioned in the specification of the disclosure may be used herein to describe various components, parts, regions, layers and/or portions, these components, parts, regions, layers and/or portions should not be limited by these terms. These terms are only used to distinguish one component, part, region, layer or portion from another component, part, region, layer or portion. Therefore, the terms such as "first component," "first part," "first region," "first layer" or "first portion" mentioned below are used to distinguish this component, part, region, layer or portion from a "second component," "second part," "second region," "second layer" or "second portion," rather than limit the order or specify components, parts, regions, layers and/or portions. Moreover, a "first" component referred to in the description may be referred to as a "second" component in the claims.

According to an embodiment of the disclosure, a width, thickness, height or area of each component, or a distance or spacing between components, may be measured by using an optical microscope (OM), a scanning electron microscope (SEM), a film thickness profilometer ($\alpha$-step), an ellipsometer, or by any other suitable way. In detail, according to some embodiments, a scanning electron microscope may be used to obtain an image containing a cross-sectional structure of a component to be measured. A width, thickness, height or area of each component, or a distance or spacing between components is measured, and the volume of the component is obtained by a suitable method (for example, integration).

In the disclosure, the various embodiments described below can be mixed or combined without departing from the spirit and scope of the disclosure. For example, some features of one embodiment may be combined with some features of another embodiment to form still another embodiment.

Reference will now be made in detail to the exemplary embodiments of the disclosure, examples of which are illustrated in the drawings. Wherever possible, the same reference numerals are used in the drawings and the description to refer to the same or similar portions.

Figure 2A:
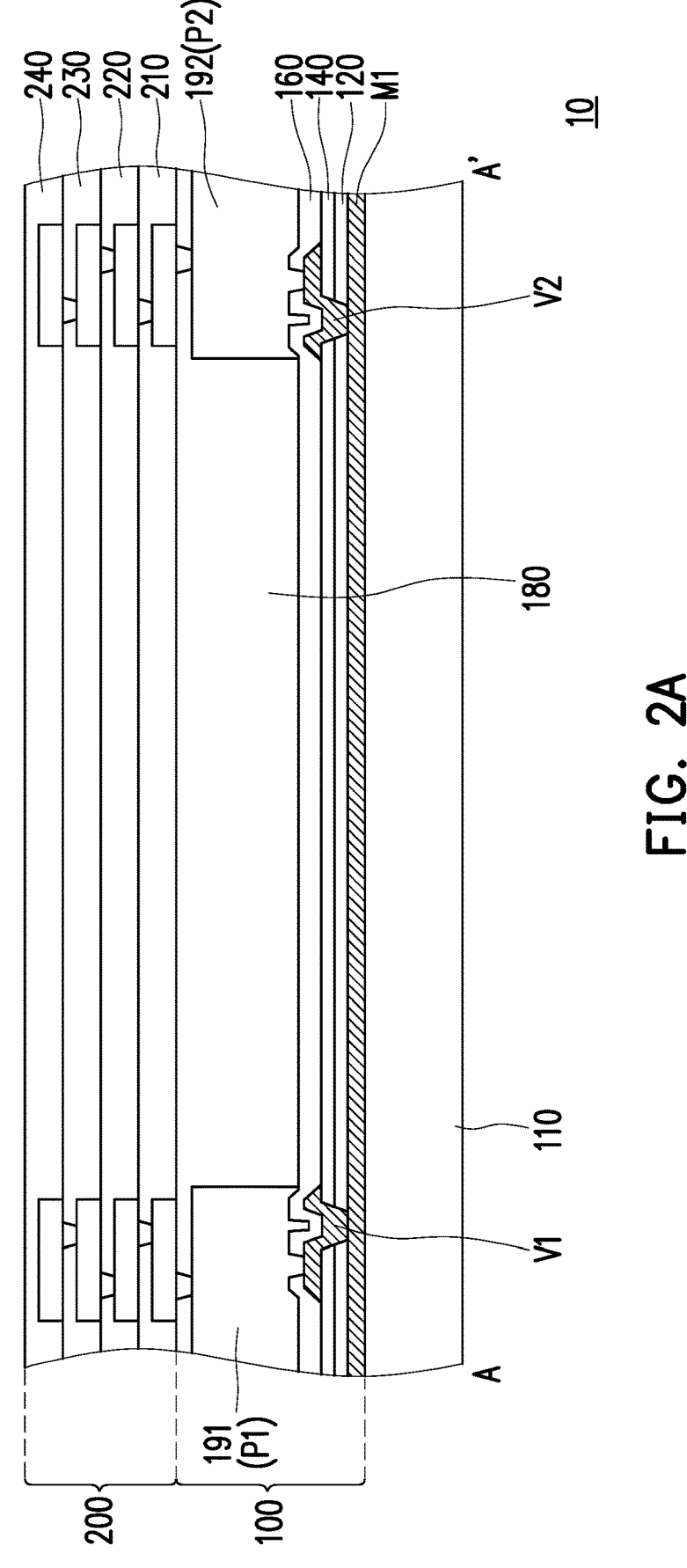
FIG. 2A is a schematic cross-sectional view of the package device of FIG. 1 along section line A-A'.
Figure 2B:
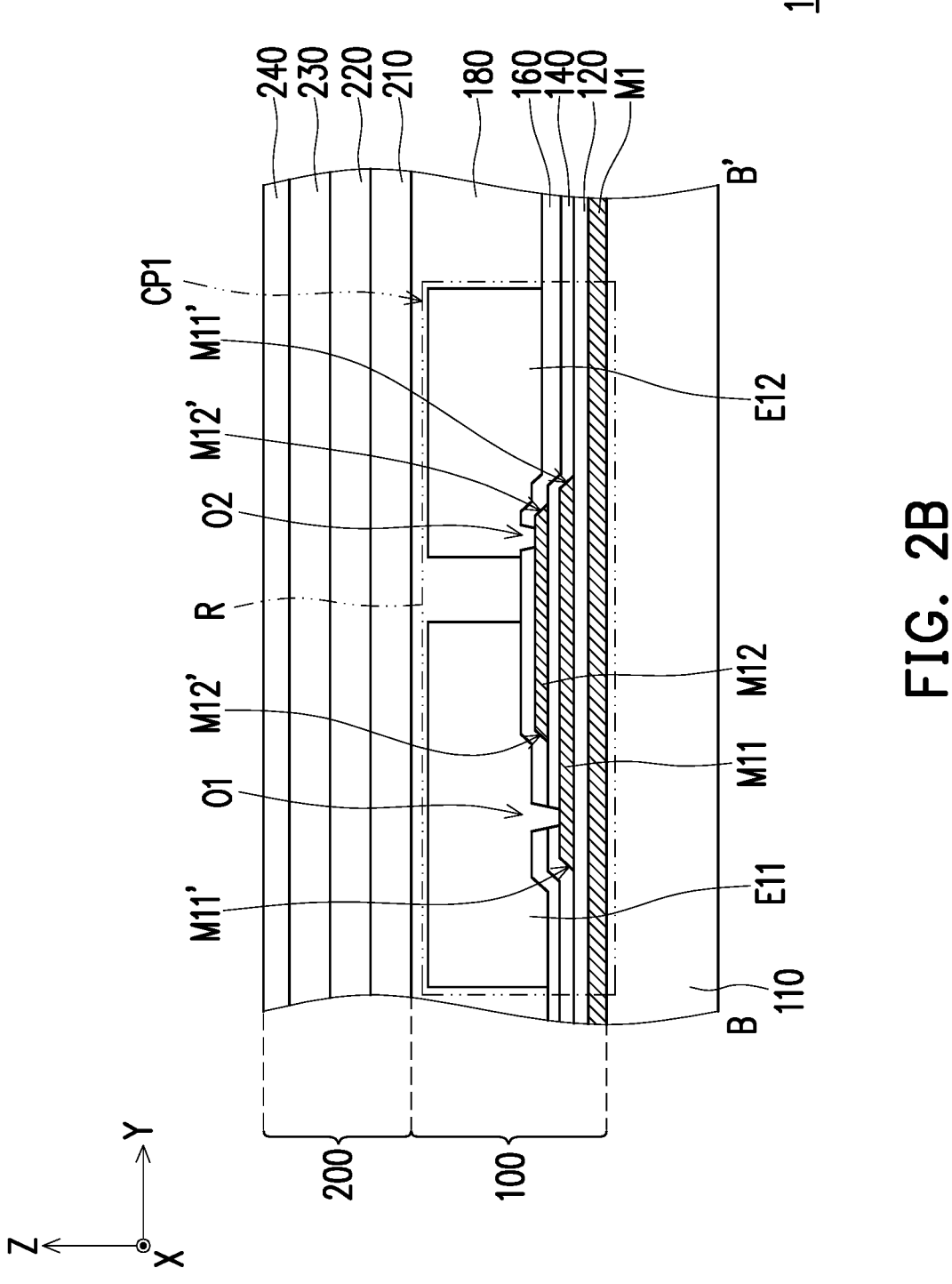
FIG. 2B is a schematic cross-sectional view of the package device of FIG. 1 along section line B-B'.
Figure 2C:
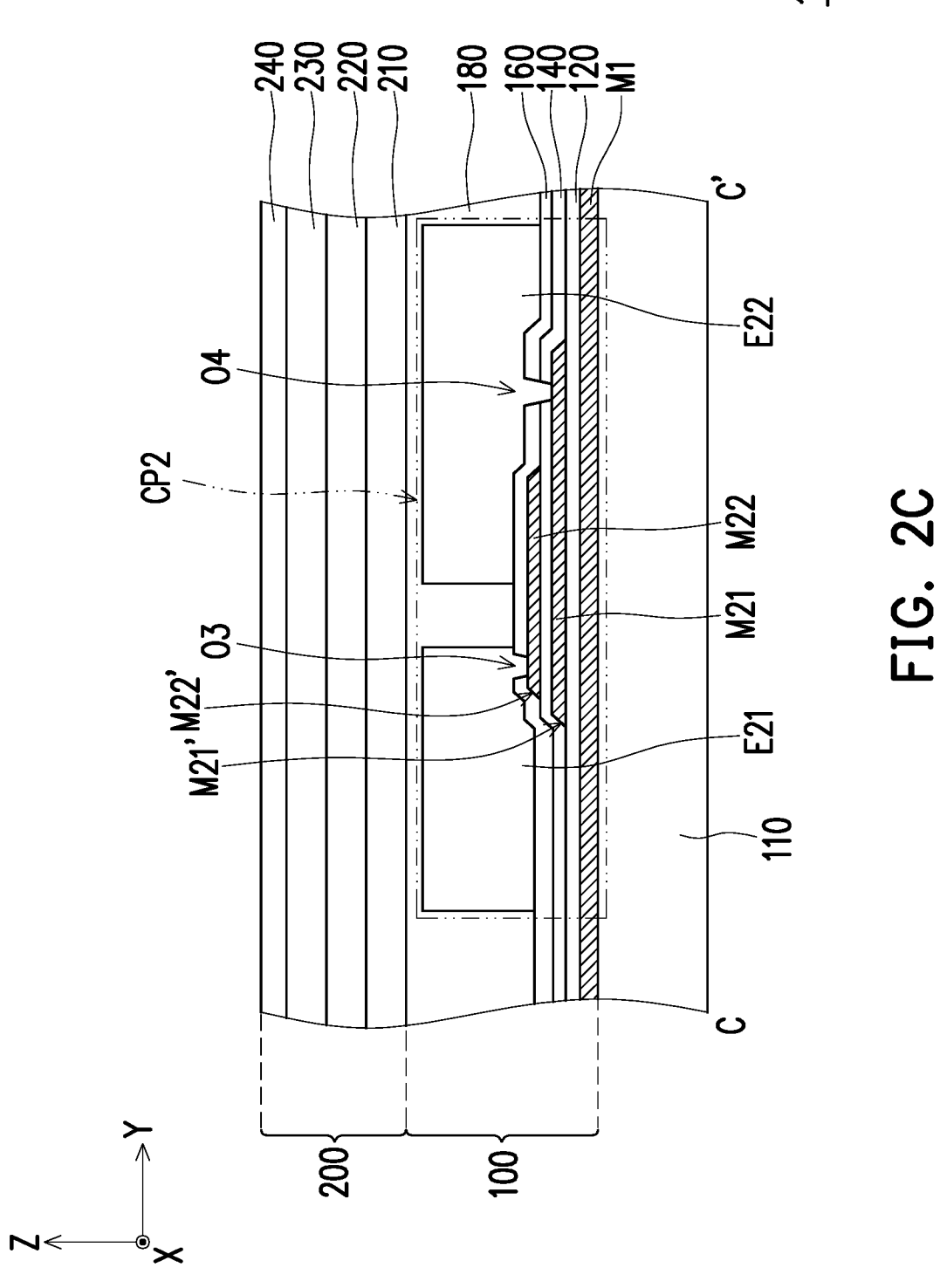
FIG. 2C is a schematic cross-sectional view of the package device of FIG. 1 along section line C-C'.
Figure 3:
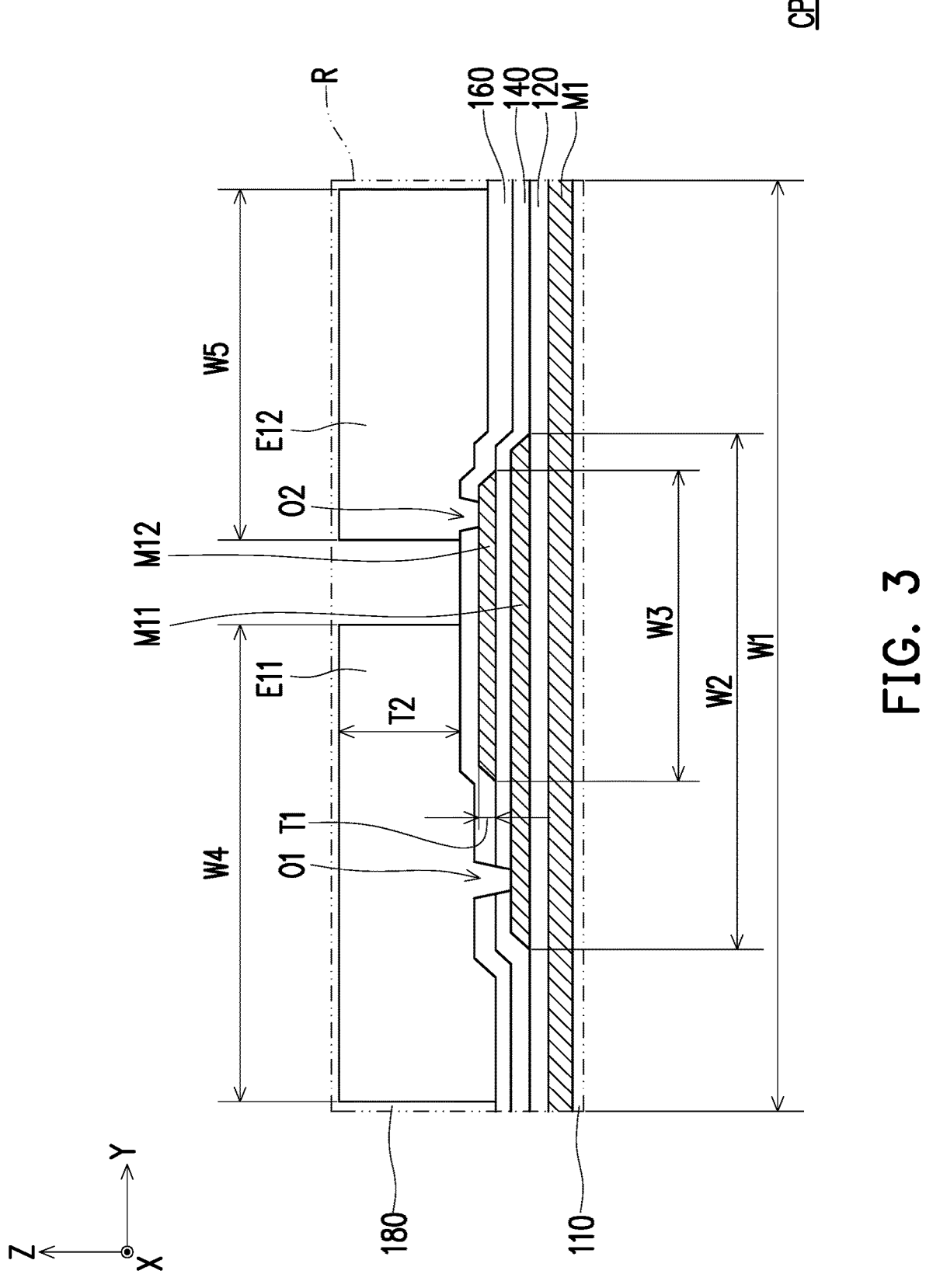
FIG. 3 is a partially enlarged schematic cross-sectional view of a region R in the package device of FIG. 2B.

FIG. 1 is a schematic top view of a package device according to an embodiment of the disclosure. FIG. 2A is a schematic cross-sectional view of the package device of FIG. 1 along section line A-A'. FIG. 2B is a schematic cross-sectional view of the package device of FIG. 1 along section line B-B'. FIG. 2C is a schematic cross-sectional view of the package device of FIG. 1 along section line C-C'. FIG. 3 is a partially enlarged schematic cross-sectional view of a region R in the package device of FIG. 2B. For clarity and ease of illustration, some components are omitted in FIG. 1, FIG. 2A, FIG. 2B, FIG. 2C and FIG. 3. A package device of the disclosure may use, for example, fan-out panel level package (FOPLP) or fan-out wafer level package (FOWLP) technology. The following describes a case of using the FOPLP technology as an example. However, the disclosure is not limited thereto. As shown in FIG. 1, FIG. 2A, FIG. 2B and FIG. 2C, a package device 10 of the disclosure includes a substrate 110. In the embodiment, the substrate 110 may be used to carry a component formed thereon during a manufacturing process of the package device 10. The substrate 110 may be, for example, a hard substrate or a soft substrate. The substrate 110 may include, for example, glass, polyimide (PI), polyethylene terephthalate (PET), or any other suitable material. According to some embodiments of the disclosure, the package device 10 may include an integrated circuit (IC) substrate. However, the disclosure is not limited thereto. Referring to FIG. 1, FIG. 2A, FIG. 2B and FIG. 2C, the package device 10 includes an integrated passive device (IPD) layer 100, a redistribution layer 200, a first port P1 and a second port P2 provided on the substrate 110. The first port P1 and the second port P2 are provided opposite to each other. The integrated passive device layer 100 may be, for example, a capacitor, an inductor, a resistor, any other suitable component, or a combination of at least two of the foregoing. In detail, in some embodiments, the integrated passive device layer 100 includes, on a Z axis (that is, in the normal direction of the substrate 110), a conductive layer M1, multiple insulating layers 120, 140, 160, and 180, and multiple electrodes (for example, M11, M12, M21 and M22) provided on the substrate 110, and a capacitor is formed through the design of insulating layer vias. However, the disclosure is not limited thereto. The integrated passive device layer 100 contacts the redistribution layer 200. The integrated passive device layer 100 includes at least one capacitor. The at least one capacitor includes a first capacitor CP1, a second capacitor CP2, or a symmetric capacitor SC including the first capacitor CP1 and the second capacitor CP2. The first port P1 and the second port P2 are each electrically connected to the first capacitor CP1 and the second capacitor CP2. For example, the first port P1 may be connected to the first capacitor CP1 and the second capacitor CP2 at one end, and the second port P2 may be connected to the first capacitor CP1 and the second capacitor CP2 at the other end opposite to the one end, so that the first capacitor CP1 and the second capacitor CP2 are connected in parallel with each other. In an embodiment of the disclosure, since the integrated passive device layer 100 has at least one symmetric capacitor SC, the first port P1 and the second port P2 have substantially the same resistance. With the above configuration, scattering parameters (also known as S-parameters) measured at each port can be substantially the same, and a capacitor having symmetry can be achieved. Accordingly, the directivity problem of the capacitor can be reduced, and electrical properties of the package device 10 can be improved.

In some embodiments of the disclosure, the Z axis is perpendicular to an X axis and a Y axis, and the X axis is perpendicular to the Y axis. A capacitor and an electrode may have a width on the X axis and a length on the Y axis. However, the disclosure is not limited thereto.

The conductive layer M1 is provided on the substrate 110. For example, the conductive layer M1 may be provided all over a surface of the substrate 110. Examples of a material of the conductive layer M1 may include molybdenum (Mo), tantalum (Ta), niobium (Nb), hafnium (Hf), nickel (Ni), chromium (Cr), cobalt (Co), zirconium (Zr), tungsten (W), aluminum (Al), titanium (Ti), copper (Cu), any other suitable metal, or an alloy or a combination of the foregoing. In some embodiments, the conductive layer M1 is, for example but not limited to, a single-layer metal layer or a laminated structure obtained by stacking multiple sub-metal layers.

The insulating layer 120, the insulating layer 140, and the insulating layer 160 are sequentially stacked on the Z axis (that is, in the normal direction of the substrate 110). The insulating layer 120, the insulating layer 140, and the insulating layer 160 may include an organic material or an inorganic material. Examples thereof may include, but not limited to, silicon nitride ($SiN_x$), silicon oxide ($SiO_x$), aluminium oxide ($Al_2O_3$), silicon oxynitride ($SiO_xN_y$), photosensitive polyimide, photosensitive polybenzoxazole (photosensitive PBO), benzocyclobutene (BCB), a polyaromatic fluorocarbon, photosensitive polyphenylene ether (photosensitive PPE) and any other suitable material.

In some embodiments, a via V1 and a via V2 may be provided in the insulating layer 120, the insulating layer 140, and the insulating layer 160. The via V1 and the via V2 may penetrate the insulating layer 120 and the insulating layer 140. In the embodiment, the package device 10 further includes a first conductive part 191 and a second conductive part 192. The first conductive part 191 may be applied as the first port P1 connected to the symmetric capacitor SC. The second conductive part 192 may be applied as the second port P2 connected to the symmetric capacitor SC. In some embodiments, the first conductive part 191 or the second conductive part 192 may be electrically connected to the conductive layer M1 and a metal layer M11, M12, M21 or M22 through the via V1 and the via V2. Details thereof will be described in subsequent paragraphs.

Referring to FIG. 2B and FIG. 2C, a first metal layer M11 and a first metal layer M21 are provided between the insulating layer 120 and the insulating layer 140. A second metal layer M12 and a second metal layer M22 are provided between the insulating layer 140 and the insulating layer 160. The insulating layer 140 is located between the first metal layers M11 and M21 and the second metal layers M12 and M22. In some embodiments, portions of the first metal layer M11 and the second metal layer M12 may constitute the first capacitor CP1, and portions of the first metal layer M21 and the second metal layer M22 may constitute the second capacitor CP2. However, the disclosure is not limited thereto. The structures of the first capacitor CP1 and the second capacitor CP2 will be described in subsequent paragraphs. A material of the first metal layers M11 and M21 and the second metal layers M12 and M22 is, for example, the same as that of the conductive layer M1. Therefore, a description thereof is omitted.

Referring to FIG. 1 and FIG. 2A, FIG. 2A is a schematic cross-sectional view of the package device of FIG. 1 along section line A-A'. The first port P1 and the second port P2 are provided oppositely on the insulating layer 160. For example, the first port P1 may be provided at an upper end of the package device 10 in FIG. 1, and the second port P2 may be provided at a lower end of the package device 10 in FIG. 1. A portion of the first port P1 may extend along the Y axis and be divided into two branches, namely, a branch P11 and a branch P12, on the X axis. A portion of the second port P2 may extend along the Y axis and be divided into two branches, namely, a branch P21 and a branch P22, on the X axis. The branches P21 and P22 may have, for example but not limited to, an arc-shaped edge. A material of the first port P1 and the second port P2 is, for example, the same as that of the conductive layer M1. Therefore, a description thereof is omitted.

The first conductive part 191 (that is, the first port P1) may be electrically connected to one of multiple electrodes (for example, one of the metal layers M11, M12, M21 and M22) through the via V1 that penetrates the insulating layers 120 and 140. The second conductive part 192 (that is, the second port P2) may be electrically connected to one of multiple electrodes (for example, one of the metal layers M11, M12, M21 and M22) through the via V2 that penetrates the insulating layers 120 and 140.

Referring to FIG. 2B, the integrated passive device layer 100 includes the first capacitor CP1. The first capacitor CP1 includes portions of the first metal layer M11 and the second metal layer M12. The integrated passive device layer 100 further includes a first electrode E11 and a second electrode E12. On the Z axis of the package device 10 (that is, in the normal direction of the substrate 110), an outer edge M12' of the second metal layer M12 is inside an outer edge M11' of the first metal layer M11. That is, in a schematic cross-sectional view, a width of the first metal layer M11 along the Y axis is greater than a width of the second metal layer M12 along the Y axis, and the Y axis and the Z axis are perpendicular to each other. However, the disclosure is not limited thereto. The first electrode E11 and the second electrode E12 are provided on the insulating layer 160. In some embodiments, the first electrode E11 and the second electrode E12 may be provided in the same layer as the first port P1 or the second port P2. In other embodiments, the first electrode E11 and the second electrode E12 may be provided in a different layer from the first port P1 or the second port P2. However, the disclosure is not limited thereto. In some embodiments, the first electrode E11 is isolated from the second electrode E12. A material of the first electrode E11 and the second electrode E12 is, for example, the same as that of the conductive layer M1. Therefore, a description thereof is omitted.

In some embodiments, the branch P11 of the first port P1 may directly contact the first electrode E11, and the branch P21 of the second port P2 may directly contact the second electrode E12. From another perspective, the branch P11 and the first electrode E11 may be integrally formed, and the branch P21 and the second electrode E12 may be integrally formed. Alternatively, the branch P11 of the first port P1 may be electrically connected to the first electrode E11 through a contact hole, and the branch P21 of the second port P2 may be electrically connected to the second electrode E12 through another contact hole. However, the disclosure is not limited thereto. In detail, the first conductive part 191 (that is, the first port P1) may be electrically connected to one of multiple electrodes (for example, one of the metal layers M11, M12, M21 and M22) through the first electrode E11 and the via V1 that penetrates the insulating layers 120 and 140. The second conductive part 192 (that is, the second port P2) may be electrically connected to one of multiple electrodes (for example, one of the metal layers M11, M12, M21 and M22) through the second electrode E12 and the via V2 that penetrates the insulating layers 120 and 140.

On the Z axis (that is, in the normal direction of the substrate 110), the first electrode E11 partially overlaps the conductive layer M1, the first metal layer M11 and the second metal layer M12. Additionally, the first metal layer M11 partially overlaps the conductive layer M1, the second metal layer M12 partially overlaps the conductive layer M1, such that, a charge could be stored between the first metal layer M11 and the conductive layer M1. The first electrode E11 is electrically connected to the first metal layer M11 through an opening O1 that penetrates the insulating layer 140 and the insulating layer 160. The second electrode E12 partially overlaps the conductive layer M1, the first metal layer M11 and the second metal layer M12. The second electrode E12 is electrically connected to the second metal layer M12 through an opening O2 that penetrates the insulating layer 140 and the insulating layer 160. With the above configuration, the first electrode E11 and the second electrode E12 are respectively electrically connected to the first capacitor CP1. The first capacitor CP1 has a structure including the conductive layer M1, the insulating layer 120, the first metal layer M11, the insulating layer 140, and the second metal layer M12, and a stored charge may be transferred to the redistribution layer 200 through the first electrode E11 or the second electrode E12. That is, the first capacitor CP1 may transfer the charge stored in the conductive layer M1, the insulating layer 120 and the first metal layer M11 to the redistribution layer 200 through the first electrode E11, and the first capacitor CP1 may transfer the charge stored in the first metal layer M11, the insulating layer 140 and the second metal layer M12 to the redistribution layer 200 through the second electrode E12. It is worth noting that the opening O1 penetrates the insulating layer 140 and the insulating layer 160, while the opening O2 only penetrates the insulating layer 160. That is, on the Z axis (that is, in the normal direction of the substrate 110), a height of the opening O1 is different from a height of the opening O2. In detail, in the embodiment shown in FIG. 2B, the height of the opening O1 may be greater than the height of the opening O2, and a bottom width of the opening O1 is roughly equal to a bottom width of the opening O2. It may be regarded that a bottom area of the opening O1 is roughly equal to a bottom area of the opening O2. In this way, volume of the first electrode E11 provided in the opening O1 is different from (for example, greater than) volume of the second electrode E12 provided in the opening O2. The height of the opening O1 may be equal to, for example, a sum of a thickness of the insulating layer 160 and a thickness of the insulating layer 140, and the height of the opening O2 may be equal to, for example, the thickness of the insulating layer 160. However, the disclosure is not limited thereto. It is to be understood that, with the above configuration, as the volume of the electrode provided in the opening differs, the resistance differs. In addition, the area of the first metal layer M11 overlapping the conductive layer M1 is different from the area of the second metal layer M12 overlapping the first metal layer M11, and the stored charges are different. With the above configuration, the first electrode E11 and the second electrode E12 have different resistances.

Referring to FIG. 2C, the integrated passive device layer 100 includes the second capacitor CP2. The second capacitor CP2 includes portions of the first metal layer M21 and the second metal layer M22. The integrated passive device layer 100 further includes a third electrode E21 and a fourth electrode E22. On the Z axis of the package device 10 (that is, in the normal direction of the substrate 110), an outer edge M22' of the second metal layer M22 is inside an outer edge M21' of the first metal layer M21. That is, in a schematic cross-sectional view, a width of the first metal layer M21 along the Y axis is greater than a width of the second metal layer M22 along the Y axis, and the Y axis and the Z axis are perpendicular to each other. However, the disclosure is not limited thereto. The third electrode E21 and the fourth electrode E22 are provided on the insulating layer 160. In some embodiments, the third electrode E21 and the fourth electrode E22 may be provided in the same layer as the first port P1 or the second port P2. In other embodiments, the third electrode E21 and the fourth electrode E22 may be provided in a different layer from the first port P1 or the second port P2. However, the disclosure is not limited thereto. In some embodiments, the third electrode E21 is isolated from the fourth electrode E22. A material of the third electrode E21 and the fourth electrode E22 is, for example, the same as that of the conductive layer M1. Therefore, a description thereof is omitted. In some embodiments, the electrodes of the disclosure may, for example, have an arc-shaped edge design. Thereby, charges can be prevented from accumulating on a tip and affecting the electrical properties. However, the disclosure is not limited thereto.

In some embodiments, the branch P12 of the first port P1 may directly contact the third electrode E21. The branch P22 of the second port P2 may directly contact the fourth electrode E22. From another perspective, the branch P12 and the third electrode E21 may be integrally formed, and the branch P22 and the fourth electrode E22 may be integrally formed. Alternatively, the branch P12 of the first port P1 may be electrically connected to the third electrode E21 through a contact hole, and the branch P22 of the second port P2 may be electrically connected to the fourth electrode E22 through another contact hole. However, the disclosure is not limited thereto. In detail, the first conductive part 191 (that is, the first port P1) may be electrically connected to one of multiple electrodes (for example, one of the metal layers M11, M12, M21 and M22) through the third electrode E21 and the via V1 that penetrates the insulating layers 120 and 140. The second conductive part 192 (that is, the second port P2) may be electrically connected to one of multiple electrodes (for example, one of the metal layers M11, M12, M21 and M22) through the fourth electrode E22 and the via V2 that penetrates the insulating layers 120 and 140.

On the Z axis (that is, in the normal direction of the substrate 110), the third electrode E21 partially overlaps the conductive layer M1, the first metal layer M21 and the second metal layer M22. The third electrode E21 is electrically connected to the first metal layer M21 through an opening O3 that penetrates the insulating layer 140 and the insulating layer 160. The fourth electrode E22 partially overlaps the conductive layer M1, the first metal layer M21 and the second metal layer M22. The fourth electrode E22 is electrically connected to the second metal layer M22 through an opening O4 that penetrates the insulating layer 140 and the insulating layer 160. With the above configuration, the third electrode E21 and the fourth electrode E22 are respectively electrically connected to the second capacitor CP2. The second capacitor CP2 has a structure including the conductive layer M1, the insulating layer 120, the first metal layer M21, the insulating layer 140, and the second metal layer M22, and a stored charge may be transferred to the redistribution layer 200 through the third electrode E21 or the fourth electrode E22. That is, the second capacitor CP2 may transfer the charge stored in the conductive layer M1, the insulating layer 120, and the first metal layer M21 to the redistribution layer 200 through the third electrode E21, and the second capacitor CP2 may transfer the charge stored in the first metal layer M21, the insulating layer 140, and the second metal layer M22 to the redistribution layer 200 through the fourth electrode E22. It is worth noting that the opening O4 penetrates the insulating layer 140 and the insulating layer 160, while the opening O3 only penetrates the insulating layer 160. That is, on the Z axis (that is, in the normal direction of the substrate 110), a height of the opening O4 is different from a height of the opening O3. In detail, in the embodiment shown in FIG. 2C, the height of the opening O4 may be greater than the height of the opening O3, and a bottom width of the opening O4 is roughly equal to a bottom width of the opening O3. It may be regarded that a bottom area of the opening O4 is roughly equal to a bottom area of the opening O3. In this way, volume of the fourth electrode E22 provided in the opening O4 is different from (for example, greater than) volume of the third electrode E21 provided in the opening O3. The height of the opening O4 may be equal to, for example, the sum of the thickness of the insulating layer 160 and the thickness of the insulating layer 140, and the height of the opening O3 may be equal to, for example, the thickness of the insulating layer 160. However, the disclosure is not limited thereto. It is to be understood that, with the above configuration, as the volume of the electrode provided in the opening differs, the resistance differs. In addition, the area of the first metal layer M21 overlapping the conductive layer M1 is different from the area of the second metal layer M22 overlapping the first metal layer M21, and the stored charges are different. With the above configuration, the third electrode E21 and the fourth electrode E22 have different resistances.

Referring to FIG. 1, FIG. 2B and FIG. 3, the region R in FIG. 3 shows a partially enlarged view of the first capacitor CP1. In some embodiments, in the region R, a length W1 of the conductive layer M1 on the Y axis is greater than a length W2 of the first metal layer M11 on the Y axis, and the length W2 of the first metal layer M11 on the Y axis is greater than a length W3 of the second metal layer M12 on the Y axis. The length W2 of the first metal layer M11 may be defined to be a maximum distance between opposite ends of the first metal layer M11. The length W3 of the second metal layer M12 may be defined to be a maximum distance between opposite ends of the second metal layer M12. With the above configuration, the impact of offset on the capacitor in a manufacturing process can be reduced, and reliability of the package device 10 can be improved.

In other embodiments, a height of the conductive layer M1 may be greater than or equal to 0.15 μm and less than or equal to 0.35 μm, a height of the first metal layer M11 may be greater than or equal to 0.15 μm and less than or equal to 0.35 μm, and a height of the second metal layer M12 may be greater than or equal to 0.15 μm and less than or equal to 0.35 μm. However, the disclosure is not limited thereto.

In some embodiments, a height T1 of the second metal layer M12 may be defined to be a maximum distance between a top surface and a bottom surface of the second metal layer M12 on the Z axis (that is, in the normal direction) of the package device 10 or the substrate 110. A height T2 of the first electrode E11 may be defined to be a maximum distance between a top surface of the first electrode E11 and a top surface of the insulating layer 160 on the Z axis (that is, in the normal direction) of the package device 10 or the substrate 110. In some embodiments, the height T2 of the first electrode E11 on the Z axis (or the height of the second electrode E12 on the Z axis may be substantially the same as the height T2 of the first electrode E11) may be greater than the height T1 of the second metal layer M12 on the Z axis (or the height of the first metal layer M11 on the Z axis may be substantially the same as the height T1 of the second metal layer M12). However, the disclosure is not limited thereto. In some embodiments, the height T2 of the first electrode E11 may be greater than or equal to 8 μm and less than or equal to 13 μm. In other embodiments, the height of the second electrode E12 may be greater than or equal to 8 μm and less than or equal to 13 μm. However, the disclosure is not limited thereto. With the above configuration, the height of the electrode (such as the first electrode E11 or the second electrode E12) may be greater than the height of the conductive layer M1, the first metal layer M11, or the second metal layer M12. In this way, the resistance of the electrode can be reduced, and the electrical properties of the package device 10 can be improved.

In some embodiments, a length W4 of the first electrode E11 is greater than a length W5 of the second electrode E12. The length W4 of the first electrode E11 may be defined to be a maximum distance between opposite ends of the first electrode E11 on the Y axis. The length W5 of the second electrode E12 may be defined to be a maximum distance between opposite ends of the second electrode E12 on the Y axis. In other words, the volume of the first electrode E11 may be greater than the volume of the second electrode E12. However, the disclosure is not limited thereto.

Referring to FIG. 1 and FIG. 2C, the second capacitor CP2 is similar to the first capacitor CP1, and a difference therebetween is that a length of the third electrode E21 connected to the first port P1 is smaller than a length of the fourth electrode E22 connected to the second port P2. In other words, the length of the fourth electrode E22 electrically connected to the first metal layer M21 is greater than the length of the third electrode E21 electrically connected to the second metal layer M22. The length of the third electrode E21 may be defined to be a maximum distance between opposite ends of the third electrode E21 on the Y axis. The length of the fourth electrode E22 may be defined to be a maximum distance between opposite ends of the fourth electrode E22 on the Y axis. In other words, the volume of the fourth electrode E22 may be greater than the volume of the third electrode E21. However, the disclosure is not limited thereto. According to some embodiments, the length W4 of the first electrode E11 of the first capacitor CP1 is greater than the length W5 of the second electrode E12, the first electrode E11 is electrically connected to the first metal layer M11 through the opening O1 that penetrates the insulating layer 140 and the insulating layer 160, the second electrode E12 is electrically connected to the second metal layer M12 through the opening O2 that penetrates the insulating layer 160, and the opening O2 is at a level above that of the opening O1, but not limited to. Therefore, the first capacitor CP1 is asymmetric in structure. In this way, a scattering parameter measured at the first electrode E11 is different from a scattering parameter measured at the second electrode E12, and the first capacitor CP1 has an asymmetric capacitance.

In the disclosure, an electrical property test may be performed on the package device 10 through, for example, a network analysis and measurement architecture. Examples of the network analysis and measurement architecture may include a network analyzer, a microscope probe platform, a high-frequency probe, a probe holder, or any other suitable instrument for measurement. In detail, by performing measurement at a "port" (for example, an electrode or port referred to in the disclosure) of the package device 10 by a network analyzer, a scattering parameter can be obtained. It is to be noted that, the term "port" mentioned herein may be defined to be an electrode, a pad or a conductive bump where a related electrical parameter may be derived and measured. However, the disclosure is not limited thereto. In the above step of obtaining the scattering parameter, one end of a probe of the network analysis and measurement architecture contacts the first electrode E11 of the first capacitor CP1, and the other end contacts the second electrode E12 of the first capacitor CP1. When the probe in contact with the first electrode E11 is grounded, the scattering parameter of the second electrode E12 can be obtained. In contrast, when the probe in contact with the second electrode E12 is grounded, the scattering parameter of the first electrode E11 can be obtained. That is, when the scattering parameter of the first electrode E11 is not equal to the scattering parameter of the second electrode E12, the first capacitor CP1 may be, for example, an asymmetric capacitor (or it may be said that the capacitor is directional). Since electrical parameters such as scattering parameter (S-parameter), impedance parameter (Z-parameter), resistance (R), reactance (X), and capacitance (C) may have conversion relationships therebetween, when the scattering parameter measured at the first capacitor CP1 is asymmetric, it means that the resistance of the first capacitor CP1 is asymmetric, and the capacitance of the first capacitor CP1 is asymmetric.

The insulating layer 180 is provided on the insulating layer 160. A material of the insulating layer 180 is similar to that of the insulating layers 120, 140, and 160. Therefore, a description thereof is omitted.

Referring to FIG. 1 and FIG. 2A, the redistribution layer 200 includes a stacked structure in which multiple circuit layers are sequentially stacked on the Z axis (that is, in the normal direction). Each circuit layer includes a dielectric layer, a conductive pattern and a conductive via. However, the disclosure is not limited thereto. For example, the redistribution layer 200 includes a dielectric layer 210, a dielectric layer 220, a dielectric layer 230 and a dielectric layer 240 sequentially stacked on the insulating layer 180 of the integrated passive device layer 100 in the normal direction (that is, on the Z axis) of the substrate 110. The dielectric layer 210, the dielectric layer 220, the dielectric layer 230 and the dielectric layer 240 may include an organic material or an inorganic material. Examples thereof may include, but not limited to, silicon nitride ($SiN_x$), silicon oxide ($SiO_x$), aluminium oxide ($Al_2O_3$), silicon oxynitride ($SiO_xN_y$), photosensitive polyimide, photosensitive PBO, BCB, a polyaromatic fluorocarbon, photosensitive PPE and any other suitable material.

Taking a single circuit layer as an example, a conductive pattern 212 and a conductive via 214 are provided in the dielectric layer 210. The conductive pattern 212 is, for example but not limited to, a circuit or a pad in the redistribution layer 200 for horizontal transmission of signals. The conductive via 214 is, for example but not limited to, a via vertically connecting different layers for vertical transmission of signals. For example, a conductive pattern 222 in the dielectric layer 220 is provided on the dielectric layer 210, and a conductive via may electrically connect the conductive pattern 212 and the conductive pattern 222 on the Z axis (that is, in the normal direction).

In other embodiments, a conductive pattern 232 is provided in the dielectric layer 230, and a conductive pattern 242 is provided in the dielectric layer 240. It is to be noted that the redistribution layer 200 shown in the embodiment is, for example, a redistribution layer including four dielectric layers. However, the disclosure is not limited thereto. In other embodiments, the number of layers in the redistribution layer 200 may be more than or less than four.

As shown in FIG. 2A, the redistribution layer 200 is provided on the integrated passive device layer 100, and the redistribution layer 200 is electrically connected to the integrated passive device layer 100. For example, the conductive pattern 212 of the redistribution layer 200 may be electrically connected to the first port P1 or the second port P2 through a conductive via (not shown) provided in the insulating layer 180. In this way, the redistribution layer 200 may be electrically connected to the first electrode E11 through the first port P1, and the redistribution layer 200 may be electrically connected to the second electrode E12 through the second port P2. In other words, the first capacitor CP1 may be electrically connected to the redistribution layer 200 through the first electrode E11 or the second electrode E12. In other embodiments, the redistribution layer 200 may be electrically connected to the third electrode E21 and the second capacitor CP2 through the first port P1. The redistribution layer 200 may be electrically connected to the fourth electrode E22 and the second capacitor CP2 through the second port P2. In other words, the second capacitor CP2 may be electrically connected to the redistribution layer 200 through the third electrode E21 or the fourth electrode E22. It is worth noting that the integrated passive device layer 100 of the package device 10 of an embodiment of the disclosure has symmetry. Specifically, the first capacitor CP1 is connected to the first port P1 and the second port P2. In the first capacitor CP1, the first electrode E11 that is greater in volume is connected to the first port P1, and the second electrode E12 that is smaller in volume is connected to the second port P2. The second capacitor CP2 is connected to the first port P1 and the second port P2. In the second capacitor CP2, the third electrode E21 that is smaller in volume is connected to the first port P1, and the fourth electrode E22 that is greater in volume is connected to the second port P2. The first capacitor CP1 is connected in parallel with the second capacitor CP2. In this way, the symmetry of the integrated passive device layer 100 may be defined as follows: the resistance measured at the first port P1 and the second port P2 when the first port P1 is grounded and the second port P2 receives a signal is substantially the same as the resistance measured at the first port P1 and the second port P2 when the first port P1 receives a signal and the second port P2 is grounded. Accordingly, the resistance of the first port P1 is substantially the same as the resistance of the second port P2.

The scattering parameter measured at the first port P1 and the second port P2 when the first port P1 is grounded and the second port P2 receives a signal is substantially the same as the scattering parameter measured at the first port P1 and the second port P2 when the first port P1 receives a signal and the second port P2 is grounded. In addition, under the above two conditions (or in a current flowing direction), the reactance and inductance (Q value) measured at the first port P1 and the second port P2 are substantially the same. In this way, the directivity problem of the capacitor can be reduced, and the electrical properties of the package device 10 can be improved. In addition, when the first port P1 is grounded and the second port P2 receives a signal, or when the first port P1 receives a signal and the second port P2 is grounded, the capacitance of the integrated passive device layer as measured is substantially the same. In this way, the electrical properties of the package device 10 can be improved.

Other embodiments will be provided and described below. It is to be noted that, in the following embodiments, the reference numerals and part of the content of the foregoing embodiments are applied, in which the same reference numerals denote the same or similar components, and description of the same technical content is omitted. The omitted content can be understood by reference to the foregoing embodiments, and will not be repeated.

Figure 4:
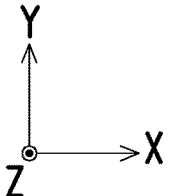
FIG. 4 is a schematic top view of a package device according to another embodiment of the disclosure.
Figure 5A:
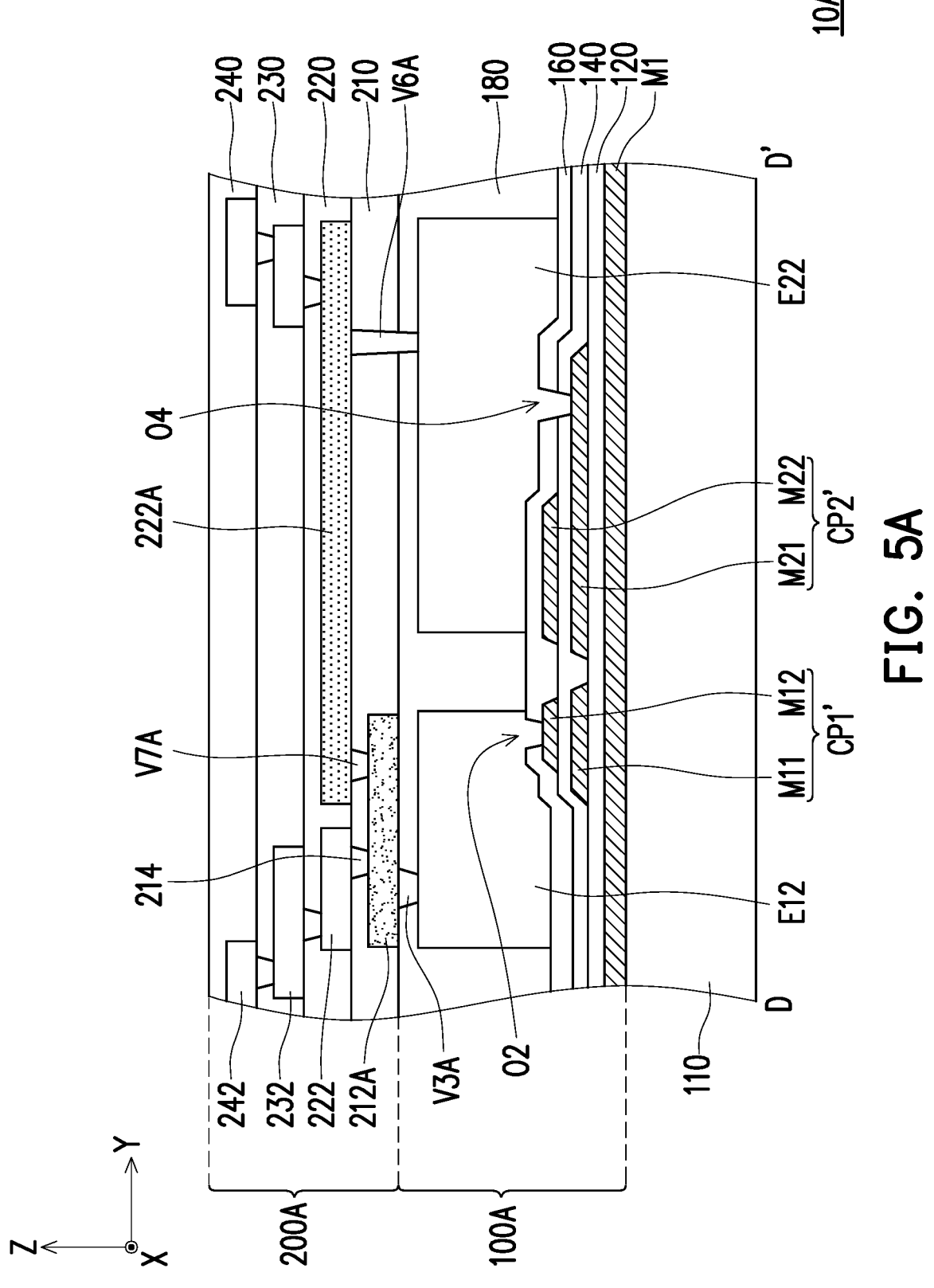
FIG. 5A is a schematic cross-sectional view of the package device of FIG. 4 along section line D-D'.
Figure 5B:
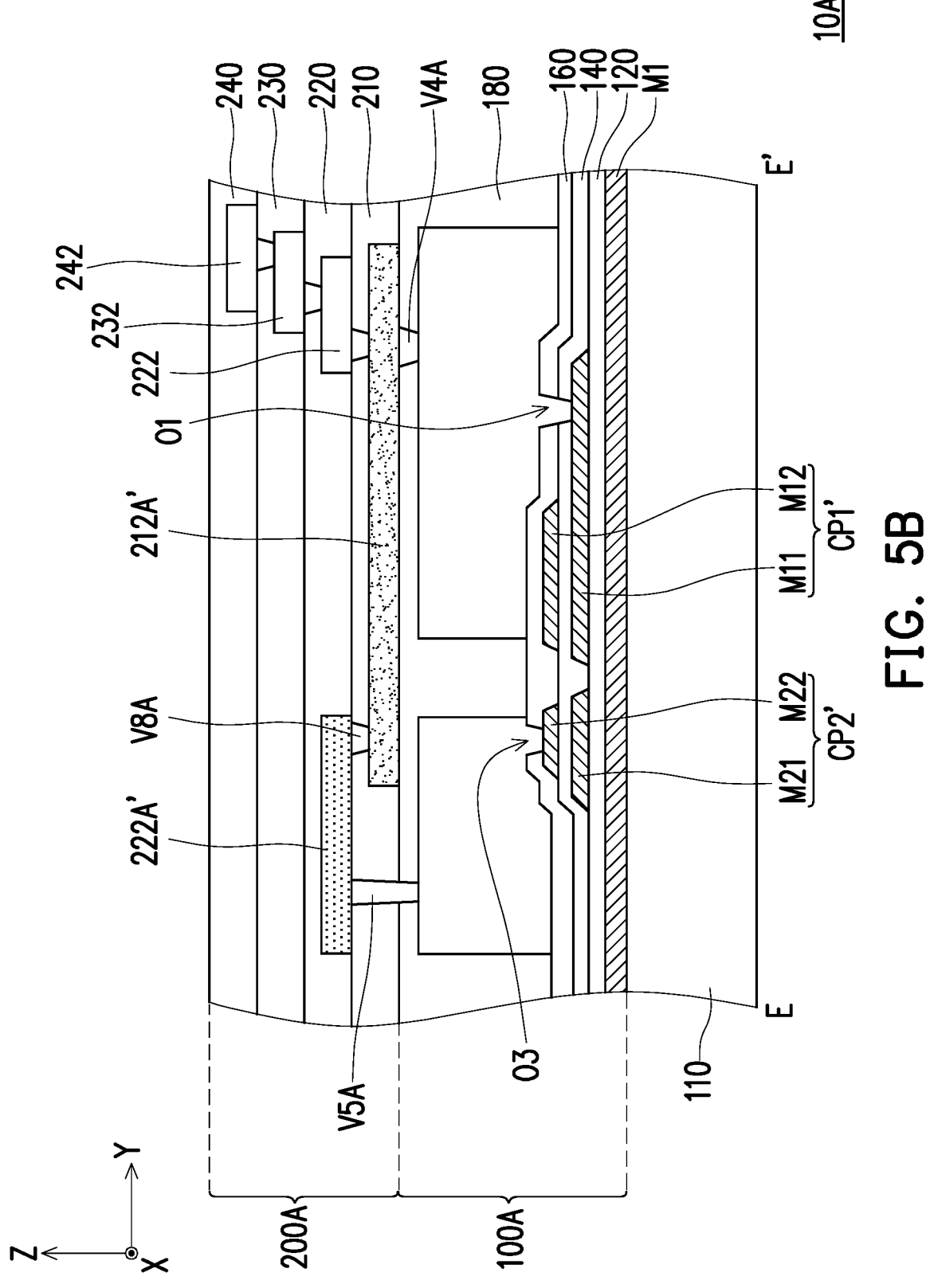
FIG. 5B is a schematic cross-sectional view of the package device of FIG. 4 along section line E-E'.

FIG. 4 is a schematic top view of a package device according to another embodiment of the disclosure. FIG. 5A is a schematic cross-sectional view of the package device of FIG. 4 along section line D-D'. FIG. 5B is a schematic cross-sectional view of the package device of FIG. 4 along section line E-E'. For clarity and ease of illustration, some components are omitted in FIG. 4, FIG. 5A and FIG. 5B. A package device 10A of the embodiment is roughly similar to the package device 10 of FIG. 1, FIG. 2B and FIG. 2C. Therefore, descriptions of the same or similar members in these two embodiments will not be repeated. The embodiment is different from the package device 10 mainly in that a symmetric capacitor SC1 includes a first capacitor CP1' and a second capacitor CP2'. The second electrode E12 electrically connected to the first capacitor CP1' and smaller in volume is connected to the branch P11 of the first port P1, and the first electrode E11 electrically connected to the first capacitor CP1' and greater in volume is connected to the branch P21 of the second port P2. The third electrode E21 electrically connected to the second capacitor CP2' and smaller in volume is connected to the branch P12 of the first port P1, and the fourth electrode E22 electrically connected to the second capacitor CP2' and greater in volume is connected to the branch P22 of the second port P2. In other words, in the package device 10A, the second electrode E12 and the third electrode E21 that are smaller in volume are connected to the first port P1, and the first electrode E11 and the fourth electrode E22 that are greater in volume are connected to the second port P2.

It is worth noting that multiple paths are provided between the first port P1 and the second port P2 of the package device 10A of an embodiment of the disclosure. Since the resistance and the reactance on different paths may be substantially the same, the resistance, scattering parameter, reactance, inductance or capacitance measured at the first port P1 and the second port P2 on different paths may be substantially the same, such that the symmetric capacitor SC1 of an integrated passive device layer 100A has symmetry. A structure of the paths and current travel routes will be briefly described below.

Referring first to FIG. 4 and FIG. 5A, the multiple paths between the first port P1 and the second port P2 at least include a first path and a second path. The first path includes, for example, the branch P11 of the first port P1, the second electrode E12 and the first capacitor CP1' connected thereto, a conductive pattern 212A, a conductive pattern 222A, the fourth electrode E22 and the second capacitor CP2' connected thereto, and the branch P22 of the second port P2. In detail, a current signal may flow into the second electrode E12 and the first capacitor CP1' through the first port P1.

Next, the current signal may enter the conductive pattern 212A through a via V3A. The via V3A is provided between the second electrode E12 and the conductive pattern 212A. The conductive pattern 212A may be provided in the same layer as the conductive pattern 212 (shown in FIG. 2A). However, the disclosure is not limited thereto.

Next, the current signal enters the conductive pattern 222A through a via V7A. The via V7A is provided between the conductive pattern 212A and the conductive pattern 222A. The conductive pattern 222A may be provided in the same layer as the conductive pattern 222. However, the disclosure is not limited thereto.

Next, the current signal enters the fourth electrode E22 through a via V6A. The via V6A is provided between the fourth electrode E22 and the conductive pattern 222A. The fourth electrode E22 is electrically connected to the second capacitor CP2'. Accordingly, the current signal may flow into the second capacitor CP2' electrically connected to the fourth electrode E22.

Next, the current signal may flow into the branch P22 of the second port P2 through the fourth electrode E22.

With the above configuration, the first capacitor CP1' or the second capacitor CP2' of the symmetric capacitor SC1 of the integrated passive device layer 100A may be electrically connected to the first port P1 or the second port P2 through the conductive pattern 212A and the conductive pattern 222A of the redistribution layer 200A.

Referring next to FIG. 4 and FIG. 5B, the second path includes, for example, the branch P12 of the first port P1, the third electrode E21 and the second capacitor CP2' connected thereto, a conductive pattern 222A', a conductive pattern 212A', the first electrode E11 and the first capacitor CP1' connected thereto, and the branch P21 of the second port P2. In detail, the current signal may flow into the third electrode E21 and the second capacitor CP2' through the first port P1.

Next, the current signal may enter the conductive pattern 222A' through a via V5A. The via V5A is provided between the third electrode E21 and the conductive pattern 222A'. The conductive pattern 222A' may be provided in the same layer as the conductive pattern 222. However, the disclosure is not limited thereto.

Next, the current signal enters the conductive pattern 212A' through a via V8A. The via V8A is provided between the conductive pattern 212A' and the conductive pattern 222A'. The conductive pattern 212A' may be provided in the same layer as the conductive pattern 212 (shown in FIG. 2A). However, the disclosure is not limited thereto.

Next, the current signal enters the first electrode E11 through a via V4A. The via V4A is provided between the first electrode E11 and the conductive pattern 212A'. The first electrode E11 is electrically connected to the first capacitor CP1'. Accordingly, the current signal may flow into the first capacitor CP1 electrically connected to the first electrode E11.

Next, the current signal may flow into the branch P21 of the second port P2 through the first electrode E11.

With the above configuration, the first capacitor CP1' or the second capacitor CP2' of the symmetric capacitor SC1 of the integrated passive device layer 100A may be electrically connected to the first port P1 or the second port P2 through the conductive pattern 212A' and the conductive pattern 222A' of the redistribution layer 200A. In addition, the conductive patterns of the redistribution layer 200A on the first path and the second path may intersect or form an X shape. However, the disclosure is not limited thereto.

It is worth noting that the symmetry of an embodiment of the disclosure may be defined as follows: the resistance of the first port P1 connected to the first path is substantially the same as the resistance of the first port P1 connected to the second path. Specifically, when the first port P1 is grounded and the second port P2 receives a signal, or when the first port P1 receives a signal and the second port P2 is grounded, the components on the first path may correspond to the components on the second path. For example, the first path and the second path both include the second electrode E12 and the third electrode E21 that are smaller in volume and the first electrode E11 and the fourth electrode E22 that are greater in volume. Specifically, the first capacitor CP1' and the second electrode E12 connected to the first capacitor CP1' are electrically connected to the second capacitor CP2' and the fourth electrode E22 connected to the second capacitor CP2' through the redistribution layer 200A, and the second capacitor CP2' and the third electrode E21 connected to the second capacitor CP2' are electrically connected to the first capacitor CP1' and the first electrode E11 connected to the first capacitor CP1' through the redistribution layer 200A. The first port P1 is connected to the second electrode E12 and the third electrode E21, and the second port P2 is connected to the first electrode E11 and the fourth electrode E22. With the above configuration, the resistance on the first path may be substantially the same as the resistance on the second path. In addition, the resistance of the second port P2 connected to the first path is substantially the same as the resistance of the second port P2 connected to the second path. That is, the resistance, scattering parameter, reactance or inductance measured at the first port P1 and at the second port P2 may be substantially the same. The first capacitor CP1' and the second capacitor CP2' may have substantially the same capacitance. In this way, the electrical properties of the package device 10A can be improved. In addition, the package device 10A may achieve similar technical effects to those of the foregoing embodiments.

Figure 6:
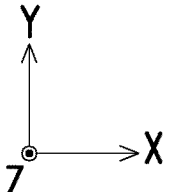
FIG. 6 is a schematic top view of a package device according to still another embodiment of the disclosure.
Figure 7A:
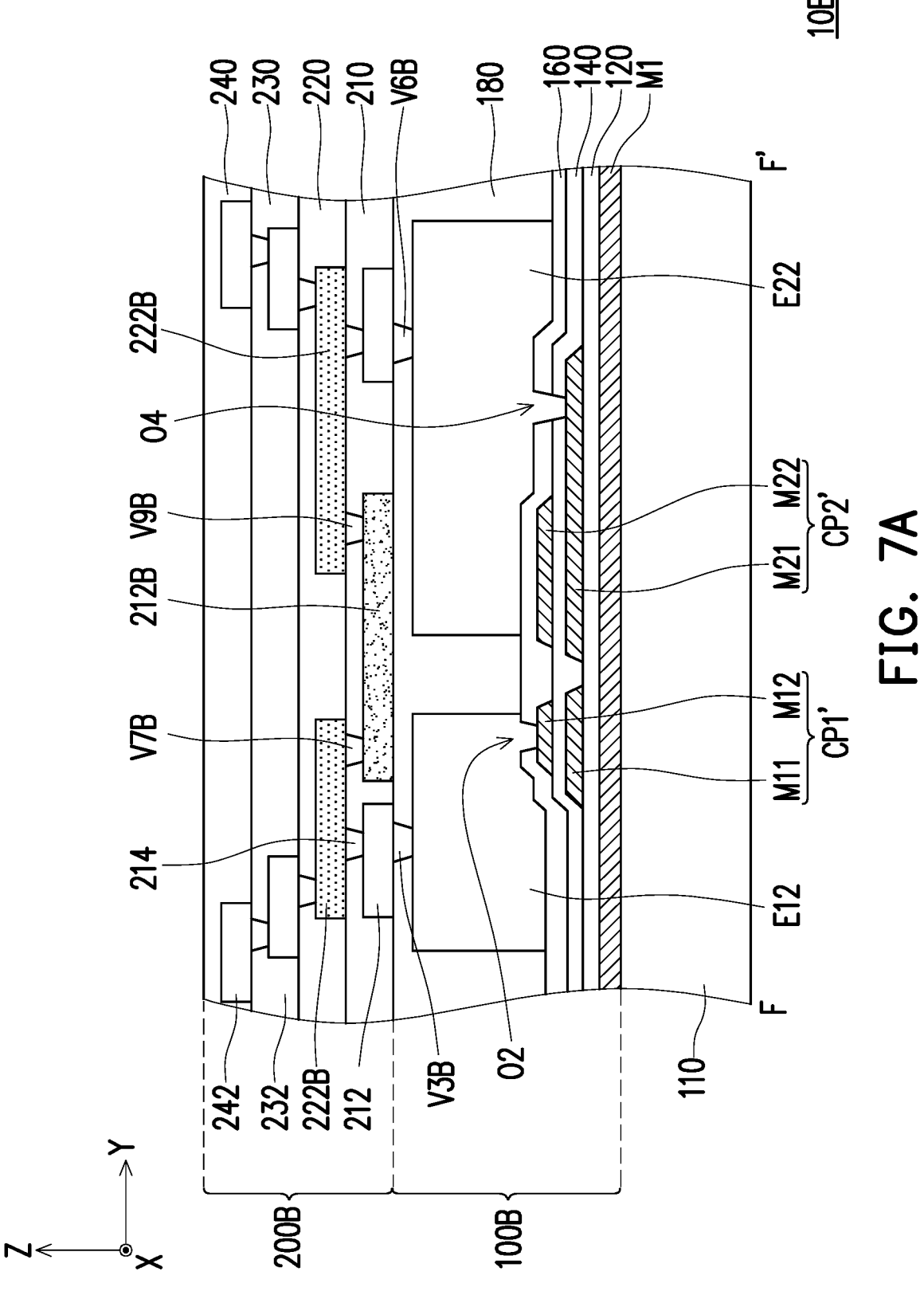
FIG. 7A is a schematic cross-sectional view of the package device of FIG. 6 along section line F-F'.
Figure 7B:
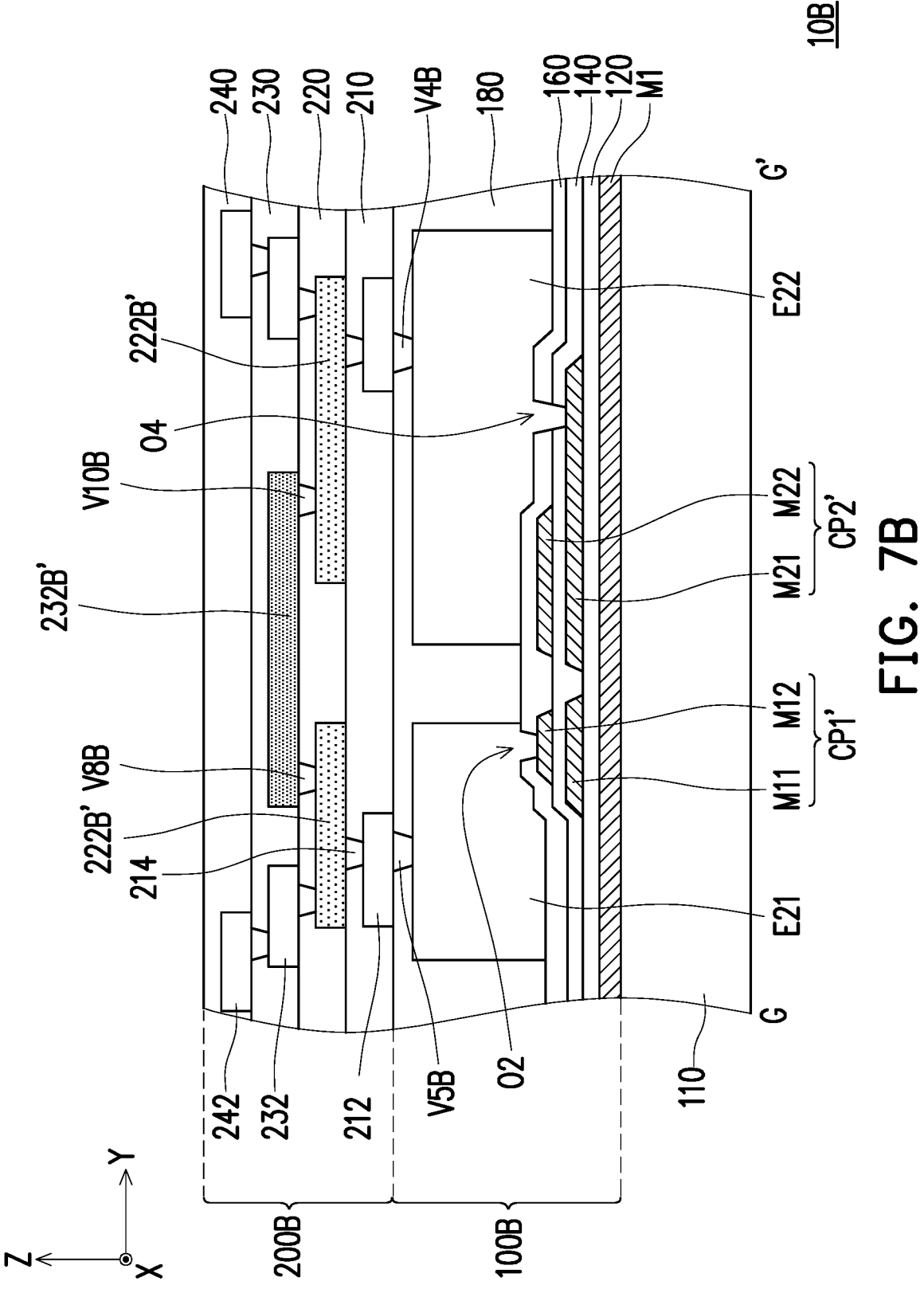
FIG. 7B is a schematic cross-sectional view of the package device of FIG. 6 along section line G-G'.

FIG. 6 is a schematic top view of a package device according to still another embodiment of the disclosure. FIG. 7A is a schematic cross-sectional view of the package device of FIG. 6 along section line F-F'. FIG. 7B is a schematic cross-sectional view of the package device of FIG. 6 along section line G-G'. For clarity and ease of illustration, some components are omitted in FIG. 6, FIG. 7A and FIG. 7B. A package device 10B of the embodiment is roughly similar to the package device 10A of FIG. 4, FIG. 5A and FIG. 2C. Therefore, descriptions of the same or similar members in these two embodiments will not be repeated. The embodiment is different from the package device 10A mainly in that a symmetric capacitor SC2 includes the first capacitor CP1' and the second capacitor CP2'. The first path and the second path of the package device 10B include three layers of conductive patterns to connect the first capacitor CP1' and the second capacitor CP2' to the first port P1 or the second port P2.

In detail, referring first to FIG. 6 and FIG. 7A, the first path includes, for example, the branch P11 of the first port P1, the second electrode E12 and the first capacitor CP1' connected thereto, a conductive pattern 222B, a conductive pattern 212B, a conductive pattern 222B, the fourth electrode E22 and the second capacitor CP2' connected thereto, and the branch P22 of the second port P2. In detail, a current signal may flow into the second electrode E12 and the first capacitor CP1' through the first port P1.

Next, the current signal may enter the conductive pattern 212 through a via V3B. The via V3B is provided between the second electrode E12 and the conductive pattern 212. The current signal then enters the conductive pattern 222B through the conductive via 214. The conductive pattern 222B may be provided in the same layer as the conductive pattern 222 (shown in FIG. 2A). However, the disclosure is not limited thereto.

Next, the current signal enters the conductive pattern 212B through a via V7B. The via V7B is provided between the conductive pattern 212B and the conductive pattern 222B. The conductive pattern 212B may be provided in the same layer as the conductive pattern 212. However, the disclosure is not limited thereto.

Next, the current signal enters the conductive pattern 222B through a via V9B. The via V9B is provided between the conductive pattern 212B and the conductive pattern 222B. The via V7B and the via V9B may be provided in the same layer as the conductive via 214. However, the disclosure is not limited thereto.

Next, the current signal enters the conductive pattern 212 through the conductive via 214, and then enters the fourth electrode E22 through a via V6B. The via V6B is provided between the fourth electrode E22 and the conductive pattern 222B. The fourth electrode E22 is electrically connected to the second capacitor CP2'. Accordingly, the current signal may flow into the second capacitor CP2' electrically connected to the fourth electrode E22.

Next, the current signal may flow into the branch P22 of the second port P2 through the fourth electrode E22.

With the above configuration, the first capacitor CP1' or the second capacitor CP2' of the symmetric capacitor SC2 of an integrated passive device layer 100B may be electrically connected to the first port P1 or the second port P2 through the conductive pattern 222B' and the conductive pattern 212 of a redistribution layer 200B.

Referring next to FIG. 6 and FIG. 7B, the second path includes, for example, the branch P12 of the first port P1, the third electrode E21 and the second capacitor CP2' connected thereto, a conductive pattern 222B', a conductive pattern 232B', a conductive pattern 222B', the first electrode E11 and the first capacitor CP1' connected thereto, and the branch P21 of the second port P2. In detail, the current signal may flow into the third electrode E21 and the second capacitor CP2' through the first port P1.

Next, the current signal may enter the conductive pattern 212 through a via V5B. The via V5B is provided between the third electrode E21 and the conductive pattern 212. The current signal then enters the conductive pattern 222B' through the conductive via 214. The conductive pattern 222B' may be provided in the same layer as the conductive pattern 222 (shown in FIG. 2A). However, the disclosure is not limited thereto.

Next, the current signal enters the conductive pattern 232B' through a via V8B. The via V8B is provided between the conductive pattern 232B' and the conductive pattern 222B'. The conductive pattern 232B' may be provided in the same layer as the conductive pattern 232. However, the disclosure is not limited thereto. In some embodiments, referring to FIG. 6, FIG. 7A and FIG. 7B together, the conductive pattern 232B' may overlap the conductive pattern 212B. That is, cross-layer bridging can be achieved by the conductive pattern 222B and the conductive pattern 222B' through the conductive pattern 212B or the conductive pattern 232B'.

Next, the current signal enters the conductive pattern 222B' through a via V10B. The via V10B is provided between the conductive pattern 232B' and the conductive pattern 222B'. The via V8B and the via V10B may be provided in the same layer as the conductive via 214. However, the disclosure is not limited thereto.

Next, the current signal enters the conductive pattern 212 through the conductive via 214, and then enters the first electrode E11 through a via V4B. The via V4B is provided between the first electrode E11 and the conductive pattern 212. The first electrode E11 is electrically connected to the first capacitor CP1'. Accordingly, the current signal may flow into the first capacitor CP1 electrically connected to the first electrode E11.

Next, the current signal may flow into the branch P21 of the second port P2 through the first electrode E11.

With the above configuration, the first capacitor CP1' or the second capacitor CP2' of the symmetric capacitor SC2 of the integrated passive device layer 100B may be electrically connected to the first port P1 or the second port P2 through three layers of conductive patterns (including the conductive pattern 212B in a lower layer, the conductive pattern 232B' in an upper layer, and the conductive patterns 222B and 222B' located between the conductive pattern 212B and the conductive pattern 232B') in the redistribution layer 200B. In addition, the conductive patterns of the redistribution layer 200B on the first path and the second path may intersect or form an X shape. However, the disclosure is not limited thereto.

With the above configuration, the resistance on the first path may be substantially the same as the resistance on the second path. In addition, the resistance of the second port P2 connected to the first path is substantially the same as the resistance of the second port P2 connected to the second path. That is, the resistance, scattering parameter, reactance or inductance measured at the first port P1 and at the second port P2 may be substantially the same. The first capacitor CP1' and the second capacitor CP2' may have substantially the same capacitance. In this way, the electrical properties of the package device 10B can be improved. In addition, the package device 10B may achieve similar electrical properties to those of the foregoing embodiments.

Figure 8:
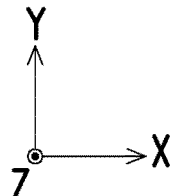
FIG. 8 is a schematic top view of a package device according to yet still another embodiment of the disclosure.

FIG. 8 is a schematic top view of a package device according to yet still another embodiment of the disclosure. For clarity and ease of illustration, some components are omitted in FIG. 8. A package device 10C of the embodiment is roughly similar to the package device 10 of FIG. 1. Therefore, descriptions of the same or similar members in these two embodiments will not be repeated. The embodiment is different from the package device 10 mainly in that a symmetric capacitor of an integrated passive device layer of the package device 10C includes more capacitors. For example, a symmetric capacitor SC3 of the integrated passive device layer includes the first capacitor CP1, the second capacitor CP2, and a third capacitor CP3. The first capacitor CP1, the second capacitor CP2 and the third capacitor CP3 are respectively connected to the first port P1 or the second port P2. The first capacitor CP1, the second capacitor CP2 and the third capacitor CP3 are connected in parallel with each other. It is to be noted that the number of capacitors shown in the embodiments of the disclosure is only for illustrative purposes. The actual number of capacitors included in a symmetric capacitor is not limited to the number shown in the drawings, and may be three, four, five or more.

In detail, the first port P1 has three branches P11, P12, and P13. The second port P2 has three branches P21, P22, and P23. The branch P11 contacts the first electrode E11 and the branch P12 contacts the second electrode E12. In this way, the branch P11 and the branch P21 are provided corresponding to the first capacitor CP1.

The branch P12 contacts the third electrode E21 and the branch P22 contacts the fourth electrode E22. In this way, the branch P12 and the branch P22 are provided corresponding to the second capacitor CP2.

In some embodiments, the integrated passive device layer further includes a fifth electrode E31 and a sixth electrode E32 provided corresponding to the third capacitor CP3. The fifth electrode E31 and the sixth electrode E32 may be similar to the first electrode E11 and the second electrode E12, respectively. In other words, the fifth electrode E31 and the sixth electrode E32 may overlap a first metal layer M31 of the third capacitor CP3. The third capacitor CP3 is, for example, a capacitor structure including the first metal layer M31, the insulating layer 140, and a second metal layer (not shown) in this order. The fifth electrode E31 may be electrically connected to the first metal layer M31, and the sixth electrode E32 may be electrically connected to the second metal layer. However, the disclosure is not limited thereto.

In some embodiments, volume of the fifth electrode E31 may be greater than that of the sixth electrode E32. However, the disclosure is not limited thereto.

The branch P13 contacts the fifth electrode E31 and the branch P23 contacts the sixth electrode E32. In this way, the branch P13 and the branch P23 are provided corresponding to the third capacitor CP3.

With the above configuration, the third capacitor CP3 is connected in parallel with the first capacitor CP1 or the second capacitor CP2.

In this way, in the package device 10C, the resistance measured at the first port P1 is the same as that measured at the second port P2. In addition, in the package device 10C, the scattering parameter, reactance or inductance measured at the first port P1 and at the second port P2 may be substantially the same. The first capacitor CP1, the second capacitor CP2, or the third capacitor CP3 may have substantially the same resistance. In this way, the electrical properties of the package device 10C can be improved. In addition, the package device 10C may achieve similar electrical properties to those of the foregoing embodiments.

Figure 9:
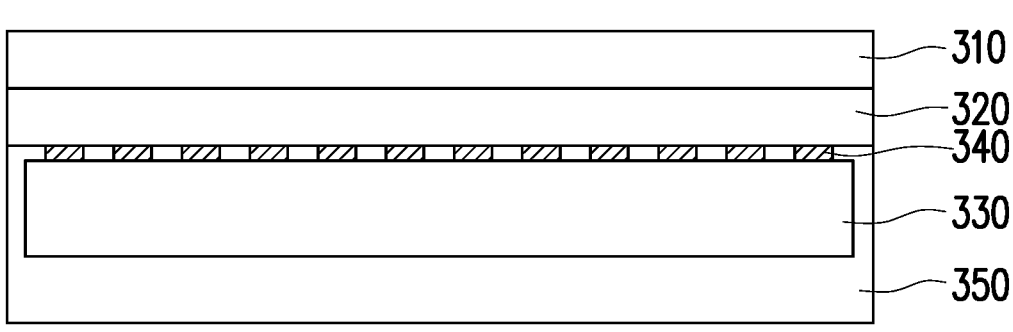
FIGS. 9-12 are schematic crossectional views of package devices according to some embodiments of the disclosure.

FIG. 9 is a schematic crosssectional view of a package device according to some embodiments of the disclosure. A package device 300 includes, for example, an integrated passive device layer 310, a redistribution layer 320, an electronic device 330, a connector 340 and an encapsulation material 350. The integrated passive device layer 310 can be implemented by the integrated passive device layer 100, 100A, or 100B depicted in the above embodiments and the details of the integrated passive device layer 310 can refer the above descriptions. The redistribution layer 320 can be implemented by the redistribution layer 200, 200A, or 200B depicted in the above embodiments and the details of the redistribution layer 320 can refer the above descriptions. Specifically, in the embodiment, the redistribution layer 320 is disposed on the electronic device 330 and the integrated passive device layer 310 is disposed on the redistribution layer 320. The connector 340 is disposed between the electronic device 330 and the redistribution layer 320 and electrically connects the electronic device 330 to the redistribution layer 320. The encapsulation material 360 surrounds the electronic device 330 to encapsulate the electronic device 330.

In some embodiments, the electronic device 330 can be an integrated circuit (IC). In some alternative embodiments, the electronic device 330 can be a printed circuit board (PCB), a capacitor, or the like. In addition, the encapsulation material 350 can be selectively omitted according to the design requirement. In some embodiments, the connector 340 can be a bonding pad formed on the surface of the electronic device 330.

In some embodiments, the package device 300 can be fabricated by using a chip first manufacturing process. Specifically, in the chip first manufacturing process, the electronic device 330 can be attached to a substrate (not shown) and encapsulated by the encapsulation material 350, the connecter 340 formed on the electronic device 330 is exposed by the encapsulation material 350, the redistribution layer 320 is formed on the connector 340 to electrically connect the electronic device 330 through the connector 340, and the integrated passive device layer 310 is formed on the redistribution layer 320. The electronic device 330 can be electrically connected to the integrated passive device layer 310 through the redistribution layer 320, but the disclosure is not limited thereto. In addition, after forming the integrated passive device layer 310, the formed structure can be singulated and separated from the substrate (not shown) to form the package device 300.

Figure 10:
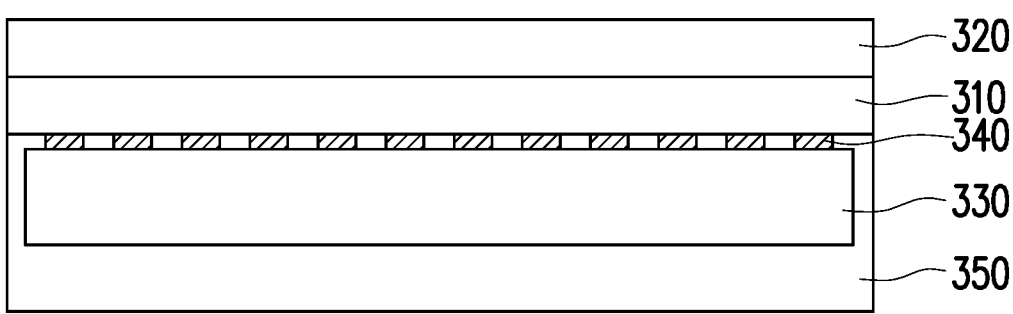

FIG. 10 is a schematic crossectional view of a package device according to some embodiments of the disclosure. A package device 300A in FIG. 10 is similar to the package device 300 and includes an integrated passive device layer 310, a redistribution layer 320, an electronic device 330, a connector 340 and an encapsulation material 350. Specifically, the package device 300A is different from the package device 300 in the stacking sequence of the integrated passive device layer 310 and the redistribution layer 320. In the package device 300A, the integrated passive device layer 310 is disposed between the redistribution layer 320 and the electronic device 330. The package device 300A can be fabricated by using the chip first manufacturing process in which the integrated passive device layer 310 is form prior to the redistribution layer 320.

Figure 11:
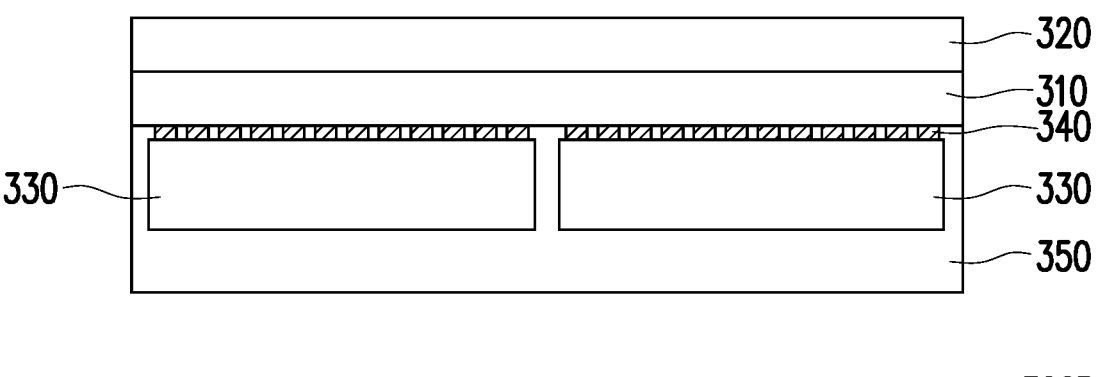

FIG. 11 is a schematic crossectional view of a package device according to some embodiments of the disclosure. A package device 300B in FIG. 11 is similar to the package device 300A and includes an integrated passive device layer 310, a redistribution layer 320, two electronic devices 330, a connector 340 and an encapsulation material 350. Specifically, the package device 300B is different from the package device 300A in the quantity of the electronic device 330. In the package device 300B, two electronic devices 330 are encapsulated by the encapsulation material 350, and the integrated passive device layer 310 and the redistribution layer 320 are formed over the two electronic devices 330. In some embodiments, the quantity of the electronic device 330 can be changed based on the required circuitry design and/or function.

Figure 12:
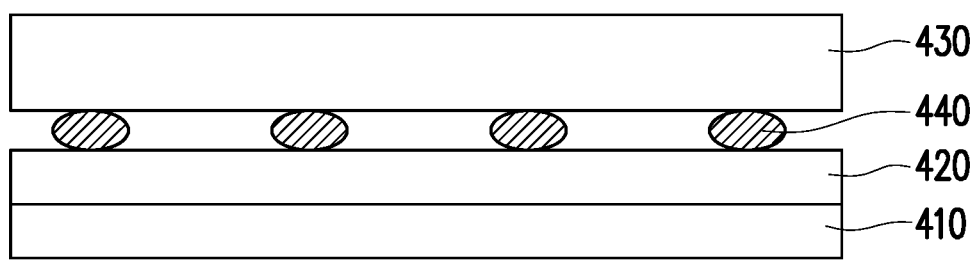

FIG. 12 is a schematic crossectional view of a package device according to some embodiments of the disclosure. A package device 400 includes, for example, an integrated passive device layer 410, a redistribution layer 420, an electronic device 430, and a connector 440. The integrated passive device layer 410 can be implemented by the integrated passive device layer 100, 100A, or 100B depicted in the above embodiments and the details of the integrated passive device layer 410 can refer the above descriptions. The redistribution layer 420 can be implemented by the redistribution layer 200, 200A, or 200B depicted in the above embodiments and the details of the redistribution layer 420 can refer the above descriptions. Specifically, in the embodiment, the integrated passive device layer 410 is disposed on the redistribution layer 420 and the electronic device 430 is disposed on the redistribution layer 420. The connector 440 is disposed between the electronic device 430 and the redistribution layer 420 and electrically connects the electronic device 430 to the redistribution layer 420. Additionally, the stacking sequence of the integrated passive device layer 410 and the redistribution layer 420 can be changed.

In some embodiments, the package device 400 can be fabricated by using a redistribution layer (RDL) first manufacturing process. Specifically, in the RDL first manufacturing process, the integrated passive device layer 410 and the redistribution layer 420 can be formed on a substrate (not shown), and the electronic device 430 can be subsequently bonded to the redistribution layer 420 through the connector 440. In the embodiment, the connector 420 can be a bump, a solder material or the like.

In summary, in the package device of an embodiment of the disclosure, since the integrated passive device layer has symmetry, the first port and the second port have substantially the same resistance. With the above configuration, the scattering parameter measured at the first port or at the second port can be substantially the same, and a symmetric capacitor can be provided. Accordingly, the directivity problem of the capacitor can be reduced. In addition, whether when the first port is grounded and the second port receives a signal or when the first port receives a signal and the second port is grounded, the resistance, scattering parameter, reactance, inductance or capacitance measured at the first port and at the second port may be substantially the same. In addition, since the resistance and the reactance on different paths may be substantially the same, the resistance, scattering parameter, reactance, inductance or capacitance measured at the first port and the second port on different paths may be substantially the same. The electrical properties of the package device can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic assembly comprising:
a stacked structure, wherein the stacked structure comprises a plurality of insulating layers and a plurality of conductive layers;
a first integrated circuit;
a first passive component disposed between the stacked structure and the first integrated circuit;
a first electrode and a second electrode disposed between the stacked structure and the first passive component;
a first conductive part electrically connected to the first electrode; and
a second conductive part electrically connected to the second electrode,
wherein the first passive component is electrically connected to the stacked structure through the first electrode and the second electrode,
wherein a portion of the first conductive part has at least one turning point in a top view of the electronic assembly,
wherein the first electrode is isolated from the second electrode, and a length of the first electrode is greater than a length of the second electrode,
wherein the first passive component overlaps with the stacked structure and the first integrated circuit.

2. The electronic assembly according to claim 1, wherein the stacked structure comprises:
a first conductive portion, a second conductive portion and a third conductive portion;
a first insulating layer disposed on the first conductive portion, the second conductive portion and the third conductive portion;
a fourth conductive portion and a fifth conductive portion disposed on the first insulating layer;
a second insulating layer disposed on the fourth conductive portion and the fifth conductive portion;
a first conductive via connected the first conductive portion and the fourth conductive portion;
a second conductive via connected the fourth conductive portion and the second conductive portion;

a third conductive via connected the second conductive
portion and the fifth conductive portion; and
a fourth conductive via connected the fifth conductive
portion and the third conductive portion.
3. The electronic assembly according to claim 1, wherein
the first passive component comprises a plurality of insu-
lating layers and a plurality of metal layers, the plurality of
metal layers comprise a first metal layer and a second metal
layer, and an outer edge of the second metal layer is inside
an outer edge of the first metal layer.
4. The electronic assembly according to claim 1, wherein
the first passive component comprises a plurality of insu-
lating layers and a plurality of metal layers, the plurality of
metal layers comprise a first metal layer, and a thickness of
the first metal layer is less than a thickness of the first
electrode.
5. The electronic assembly according to claim 1, wherein
the stacked structure is contained in a redistribution layer.
6. The electronic assembly according to claim 1, wherein
the first passive component comprises a capacitor, an induc-
tor or a resistor.
7. The electronic assembly according to claim 1, further
comprising:
a second passive component adjacent the first passive
component.
8. The electronic assembly according to claim 1, further
comprising:
a second integrated circuit adjacent the first integrated
circuit.
9. The electronic assembly according to claim 1, wherein
the electronic assembly comprises a package device.

* * * * *